United States Patent
Gaul et al.

(10) Patent No.: US 8,859,337 B2
(45) Date of Patent: Oct. 14, 2014

(54) THERMAL MATCHING IN SEMICONDUCTOR DEVICES USING HEAT DISTRIBUTION STRUCTURES

(75) Inventors: Stephen J Gaul, Melbourne Village, FL (US); Steven Howard Voldman, South Burlington, VT (US); Jean-Michel Tschann, Melbourne, FL (US)

(73) Assignee: Soitec, Bernin (FR)

( * ) Notice: Subject to any disclaimer, the term of this patent is extended or adjusted under 35 U.S.C. 154(b) by 313 days.

(21) Appl. No.: 12/966,728

(22) Filed: Dec. 13, 2010

(65) Prior Publication Data

US 2011/0141696 A1    Jun. 16, 2011

Related U.S. Application Data

(60) Provisional application No. 61/286,467, filed on Dec. 15, 2009.

(51) Int. Cl.
| | |
|---|---|
| *H01L 21/00* | (2006.01) |
| *H01L 29/861* | (2006.01) |
| *H01L 23/367* | (2006.01) |
| *H01L 23/60* | (2006.01) |
| *H01L 23/373* | (2006.01) |
| *H01L 29/737* | (2006.01) |
| *H01L 29/73* | (2006.01) |
| *H01L 29/06* | (2006.01) |

(52) U.S. Cl.
CPC ............ *H01L 29/861* (2013.01); *H01L 29/737* (2013.01); *H01L 29/73* (2013.01); *H01L 29/0653* (2013.01); *H01L 23/367* (2013.01); *H01L 23/60* (2013.01); *H01L 23/3732* (2013.01); *H01L 2924/14* (2013.01); *H01L 23/3677* (2013.01)
USPC .................................. 438/122; 257/E21.499

(58) Field of Classification Search
CPC ......... H01L 21/00; H01L 23/00; H01L 27/00; H01L 29/00
USPC .................................... 257/E21.499; 438/122
See application file for complete search history.

(56) References Cited

U.S. PATENT DOCUMENTS

| | | | |
|---|---|---|---|
| 5,420,443 | A | 5/1995 | Dreifus et al. |
| 5,561,303 | A | 10/1996 | Schrantz et al. |
| 5,767,678 | A | 6/1998 | Mercer |
| 5,803,967 | A | 9/1998 | Plano et al. |
| 5,895,972 | A | 4/1999 | Paniccia |

(Continued)

FOREIGN PATENT DOCUMENTS

CN        1319888 A    10/2001

OTHER PUBLICATIONS

Aleksov et al., "Silicon-on-diamond: An Advanced Silicon-on-Insulator Technology", "Diamond & Related Materials", 2005, pp. 308-313, vol. 14, Publisher: Elsevier B.V.

(Continued)

*Primary Examiner* — Telly Green
(74) *Attorney, Agent, or Firm* — TraskBritt

(57) ABSTRACT

Embodiments described herein provide a chip, comprising a first device on a substrate and a second device on the substrate. The chip further comprises a heat distribution structure in thermal proximity to the first device and the second device, wherein the heat distribution structure is thermally isolated and reduces a thermal gradient between the first device and the second device.

10 Claims, 12 Drawing Sheets

(56) References Cited

U.S. PATENT DOCUMENTS

| | | | |
|---|---|---|---|
| 6,075,701 A * | 6/2000 | Ali et al. | 361/704 |
| 6,096,582 A | 8/2000 | Inoue et al. | |
| 6,288,426 B1 | 9/2001 | Gauthier, Jr. et al. | |
| 6,387,742 B2 * | 5/2002 | Gauthier et al. | 438/197 |
| 6,649,937 B2 | 11/2003 | Searls et al. | |
| 6,652,763 B1 | 11/2003 | Wei et al. | |
| 6,673,684 B1 | 1/2004 | Huang et al. | |
| 6,861,745 B2 | 3/2005 | Akram et al. | |
| 7,492,041 B2 | 2/2009 | Ravi et al. | |
| 7,679,160 B2 * | 3/2010 | Udrea et al. | 257/492 |
| 2002/0141155 A1 * | 10/2002 | Pinneo | 361/688 |
| 2003/0025198 A1 | 2/2003 | Chrysler et al. | |
| 2003/0183823 A1 | 10/2003 | Searls et al. | |
| 2004/0157386 A1 | 8/2004 | Chrysler et al. | |
| 2004/0238946 A1 | 12/2004 | Tachibana et al. | |
| 2005/0017351 A1 | 1/2005 | Ravi | |
| 2005/0041560 A1 | 2/2005 | Katsuma et al. | |
| 2005/0179126 A1 | 8/2005 | Ravi et al. | |
| 2006/0067137 A1 * | 3/2006 | Udrea et al. | 365/189.09 |
| 2007/0216024 A1 | 9/2007 | Ono et al. | |
| 2007/0269964 A1 | 11/2007 | Sung | |
| 2008/0298021 A1 | 12/2008 | Ali et al. | |
| 2009/0061252 A1 | 3/2009 | Zimmer et al. | |
| 2010/0140790 A1 * | 6/2010 | Setiadi et al. | 257/698 |
| 2010/0276701 A1 | 11/2010 | Hebert et al. | |
| 2011/0140232 A1 | 6/2011 | Gaul et al. | |
| 2011/0223321 A1 * | 9/2011 | Zimmer et al. | 427/123 |

OTHER PUBLICATIONS

Francis et al., "GaN-HEMT Epilayers on Diamond Substrates: Recent Progress", "Available at http://www.csmantech.org/Digests/2007/2007%20Papers/07d.pdf", May 14-17, 2007, pp. 133-136, Publisher: CS MANTECH Conference, Published in: Austin, TX.

Kawai et al., "Low Temperature Growth of Diamond Electrode with Seeding Pretreatment Using Diamond Nanoparticles", "H1—Nanostructure and Function of Fullerenes, Carbon Nanotubes, and Related Materials", 2008, p. 1, Publisher: The Electrochemical Society.

Naguib et al., "Enhanced nucleation, smoothness and conformality of ultrananocrystalline diamond (UNCD) ultrathin films via tungsten int", "Chemical Physics Letters", 2006, pp. 345-350, vol. 430, Publisher: Elsevier B.V.

Zimmer, Jerry and Edward Palen, "Diamond Heat Spreaders Maximize Emitter Power and Lifetime", May 1, 2006, pp. 1-2, vol. 42, No. 5, Publisher: LaserFocusWorld.

Zimmer, J. and G. Chandler, "GaN on SOD Substrates—The Next Step in Thermal Control", "Available at http://www.csmantech.org/Digests/2007/2007%20Papers/07c.pdf", May 14-17, 2007, Publisher: CS MANTECH Conference.

Zimmer, Jerry W. and Gerry Chandler, "Advances in Large Diameter GaN on Diamond Substrates", "Available at http://www.csmantech.org/Digests/2008/2008%20Papers/9.2.pdf", pApr. 14-17, 2008, pp. 1-4, Publisher: CS MANTECH Conference.

U.S. Patent and Trademark Office, "Office Action", "U.S. Appl. No. 12/612,616", Aug. 16, 2012, pp. 1-23.

"CVD Diamond: Diamond Heatspreaders and Heatsinks for Thermal Management Applications", "http://www.diamond-materials.com/prod_heatspreaders_en.htm accessed Nov. 23, 2010", 2010, Publisher: Fraunhofer IAF or DM.

"DiaTherm Low Cost CVD Diamond Heat-Spreaders", "http://sp3diamondtech.com/pdf/OpticalThermalManagement.pdf", 2008, Publisher: sp3 diamond technologies.

Goodson et al., "Improved Heat Sinking for Laser-Diode Arrays Using Microchannels in CVD Diamond", "IEEE Transactions on Components, Packaging, and Manufacturing Technology—Part B", Feb. 1997, pp. 104-109, vol. 20, No. 1, Publisher: IEEE.

Jagannadham, "Multilayer Diamond Heat Spreaders for Electronic Power Devices", "Solid-State Electronics: An International Journal", Dec. 1998, pp. 2199-2208, vol. 42, No. 12, Publisher: Elsevier Science Ltd.

May, Paul, "Diamond Thin Films: A 21st-Century Material", "Philisophical Transactions of the Royal Society", 2000, pp. 473-495, vol. A, Publisher: The Royal Society.

Yoganand et al., "Integrated AlN/diamond heat spreaders for silicon device processing", "Journal of Vacuum Science Technology", Nov./Dec. 2002, pp. 1974-1982, vol. 20, No. 6, Publisher: American Vacuum Society.

"Study of Fusion Bonding of Diamond to Silicon for Silicon-on-Diamond Technology", "Applied Physics Letters", Oct. 21, 2002, pp. 3275-3277, vol. 81, No. 17, Publisher: American Institute of Physics.

Chinese First Office Action and Search Report for Chinese Application No. 201010601748.9 dated Nov. 27, 2013, 13 pages.

Chinese Second Office Action and Search Report for Chinese Application No. 201010601748.9 dated Jul. 31, 2014, 17 pages.

* cited by examiner

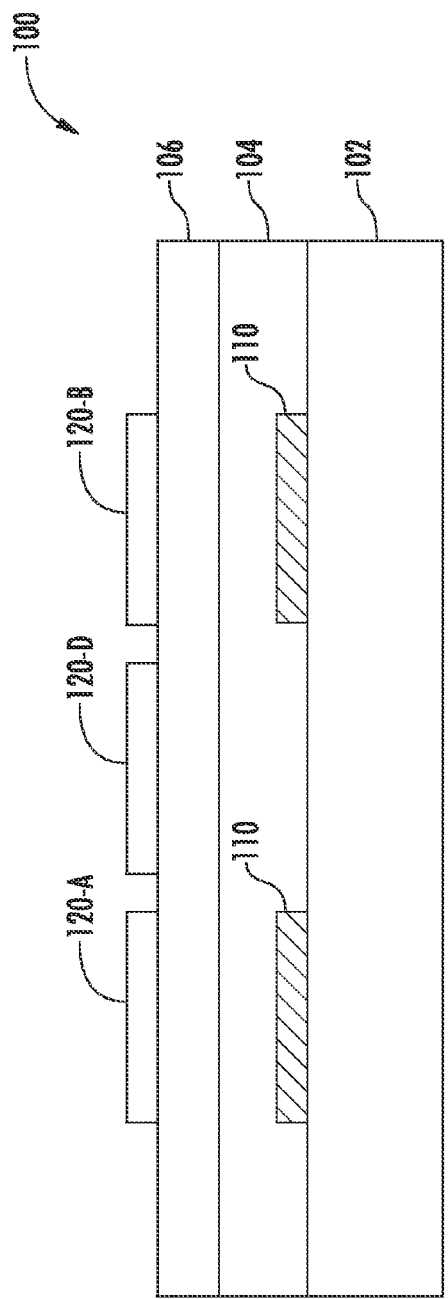
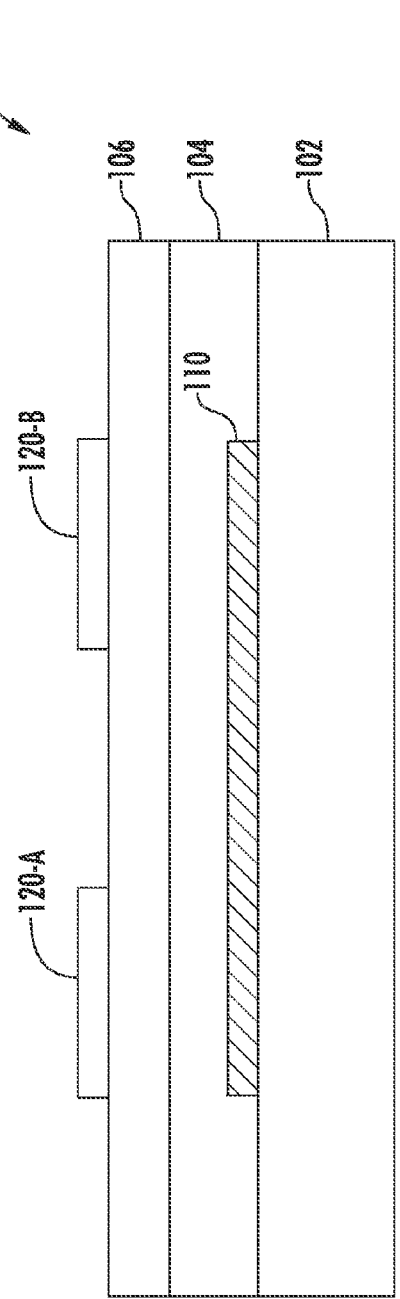

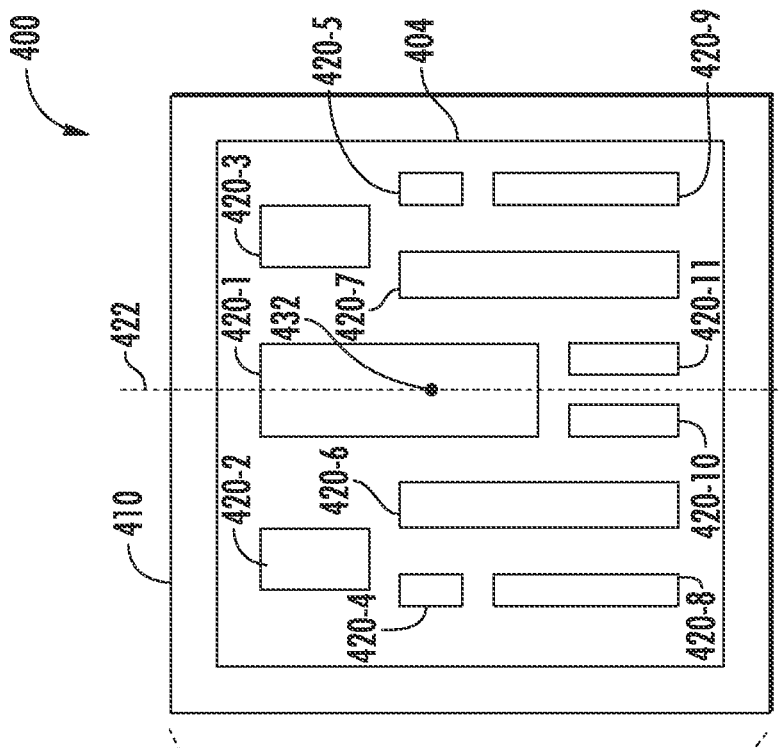
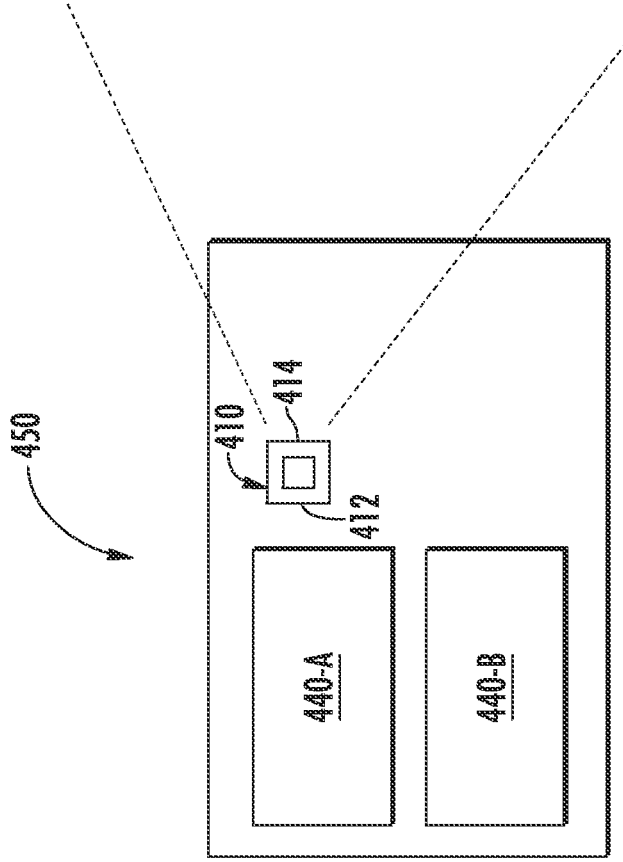
FIG. 4A
FIG. 4B

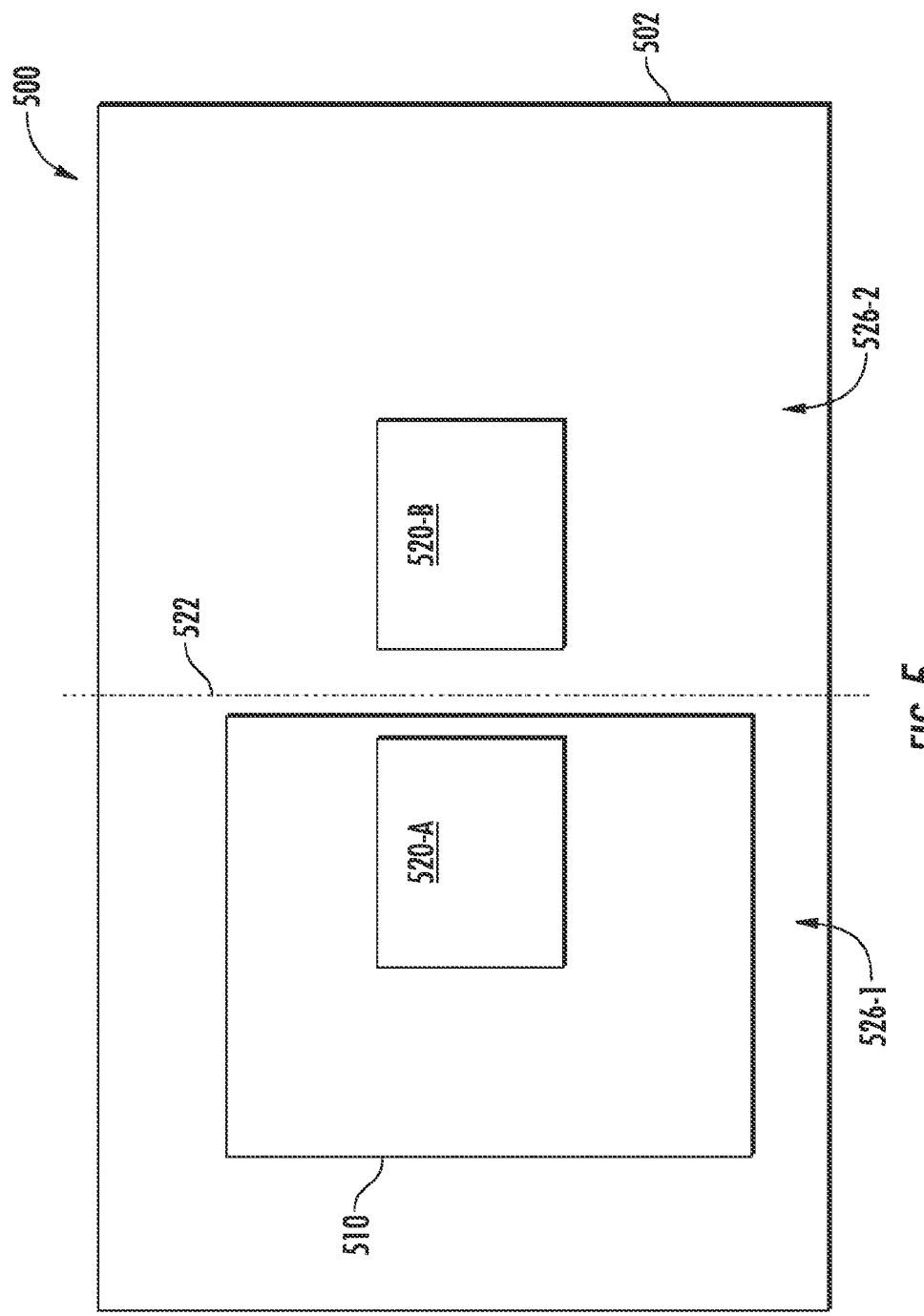

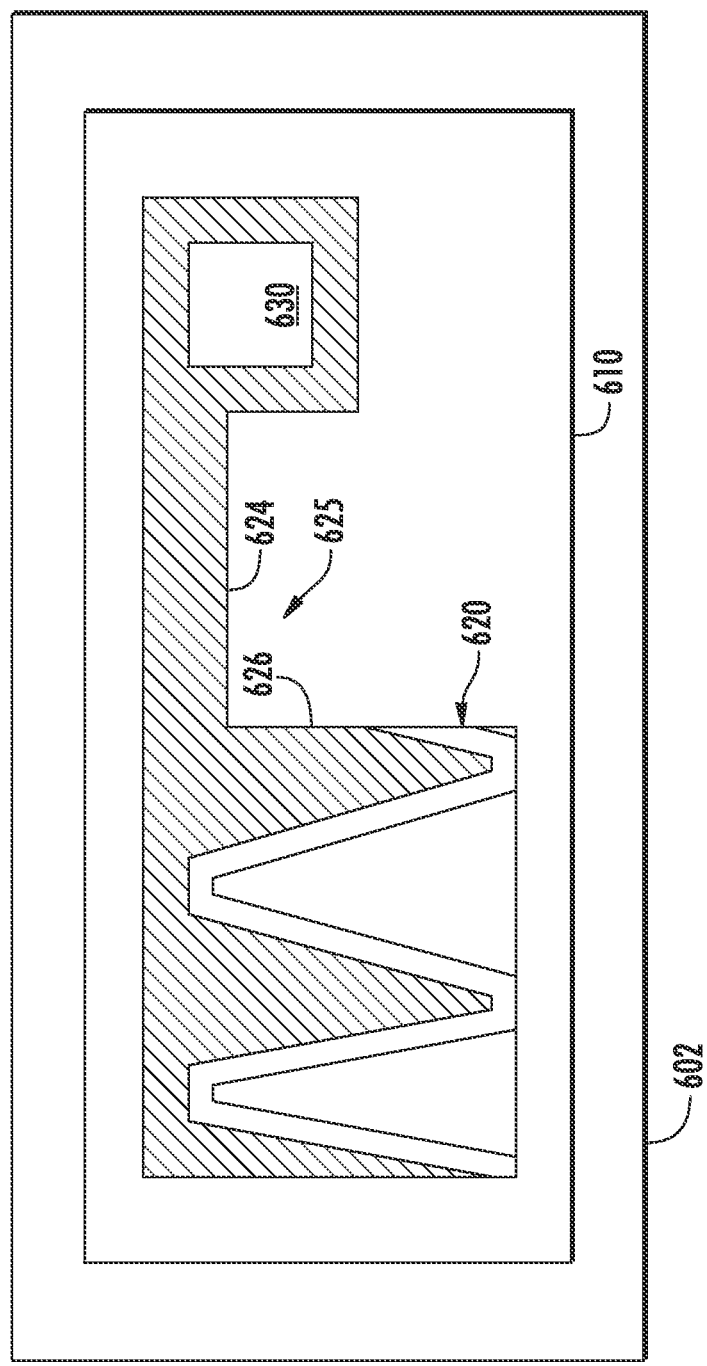

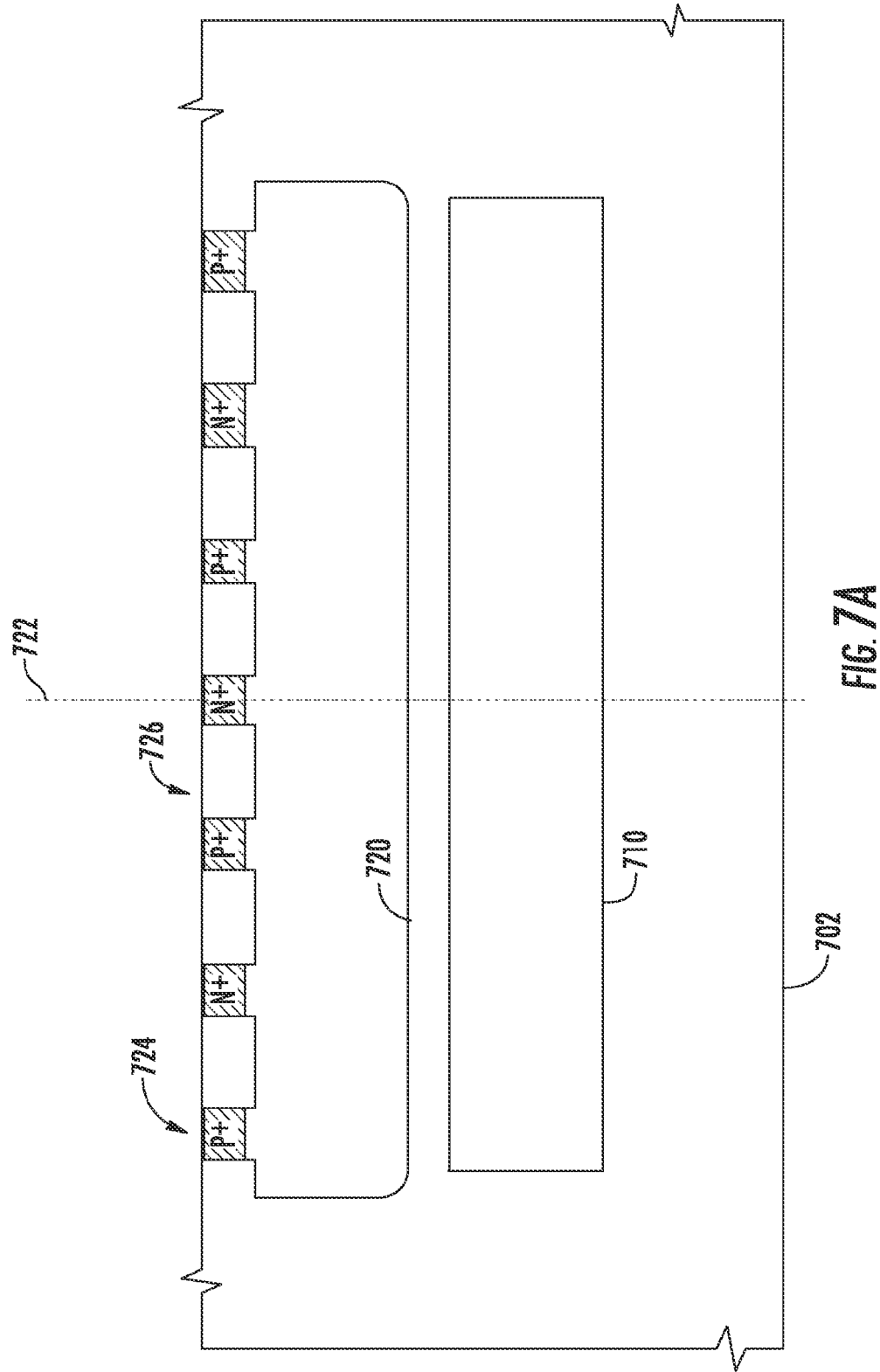

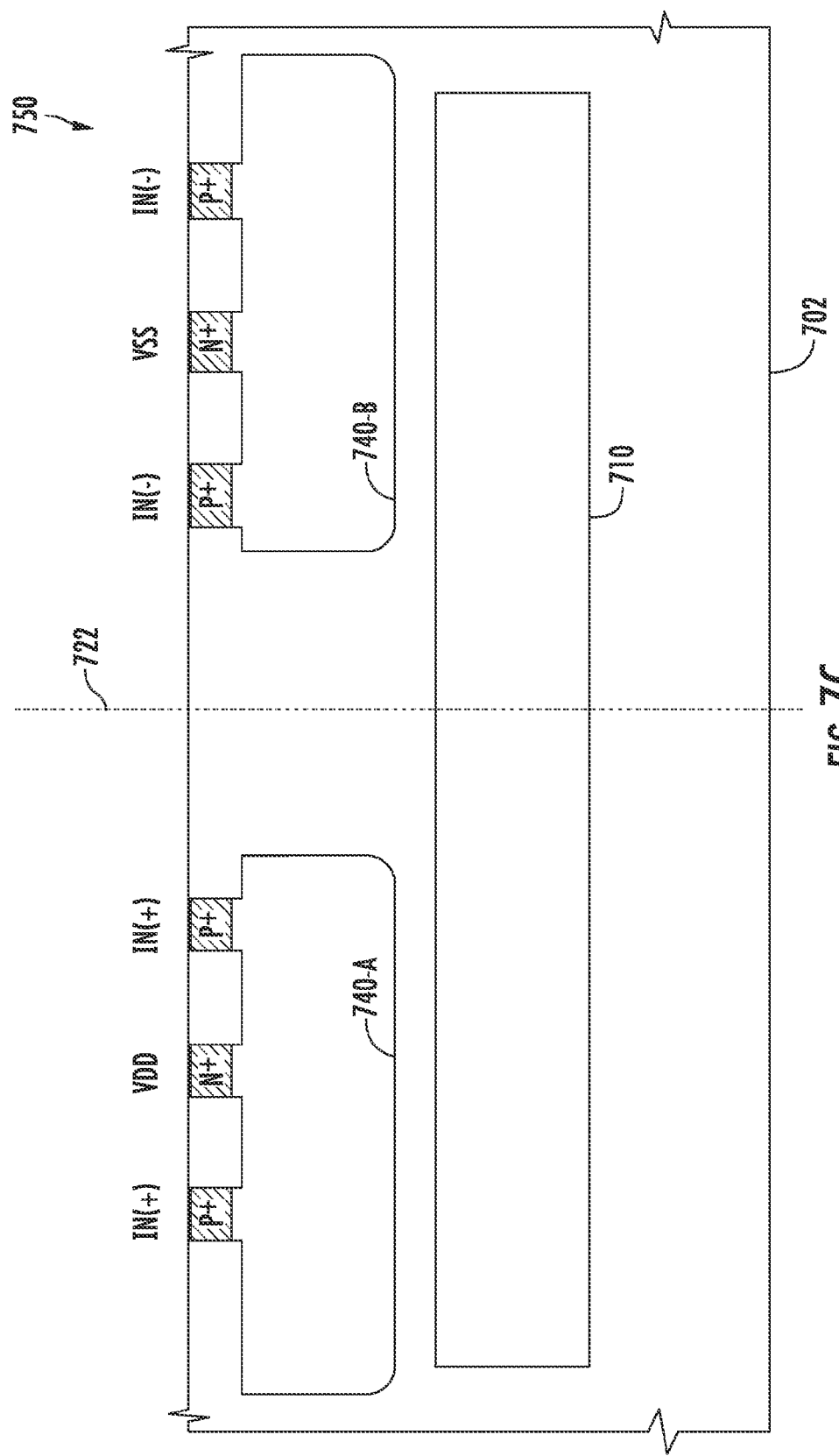

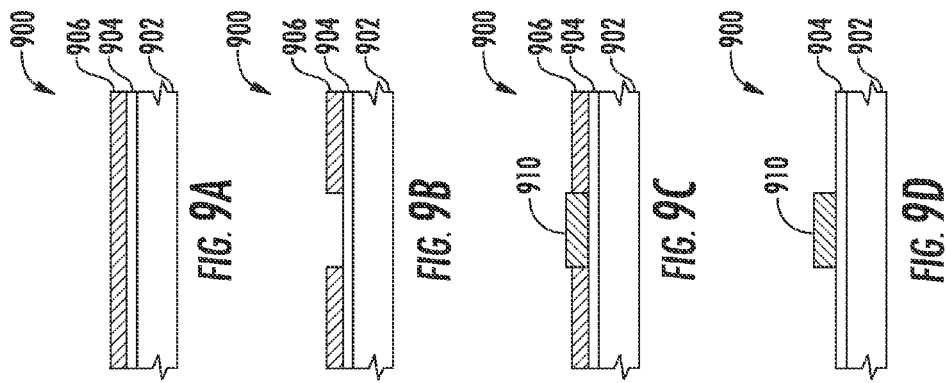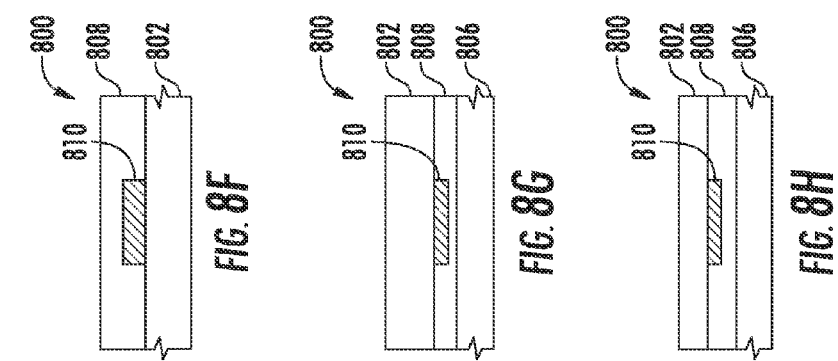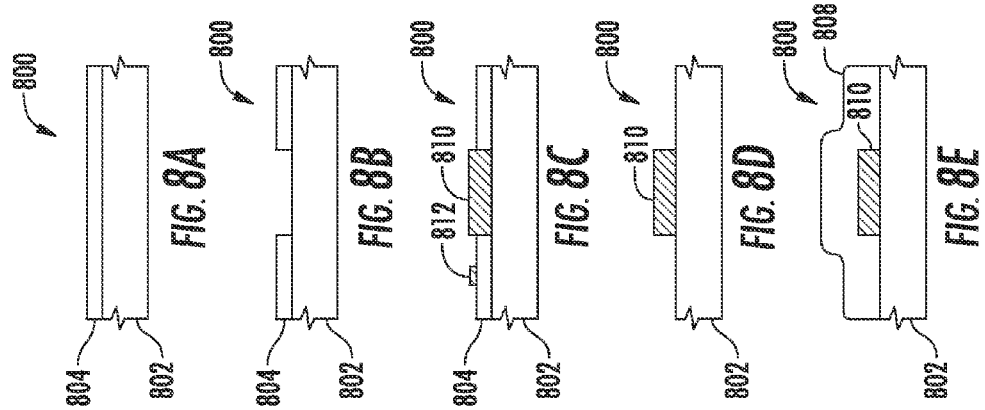

//

US 8,859,337 B2

THERMAL MATCHING IN SEMICONDUCTOR DEVICES USING HEAT DISTRIBUTION STRUCTURES

CROSS-REFERENCE TO RELATED APPLICATIONS

This application is related to U.S. Provisional Patent Application Ser. No. 61/286,467 entitled "DIAMOND HEAT SPREADING STRUCTURES," filed on Dec. 15, 2009 and referred to herein as the '467 application. The present application hereby claims the benefit of U.S. Provisional Patent Application No. 61/286,467. The '467 application is hereby incorporated herein by reference.

DRAWINGS

FIGS. 1A-1C are views of one embodiment of a chip having a heat distribution structure.

FIG. 4A is a block diagram of one embodiment of an analog macro layout.

FIG. 4B is a block diagram of one embodiment of an integrated chip layout including the analog macro layout of FIG. 4A.

FIG. 5 is a block diagram of one embodiment of a chip having asymmetrical thermal matching.

FIG. 6 is a top down view of one embodiment of a heat distribution structure for improving performance of an electrical connection of an output device.

FIGS. 7A-7C are cross-sectional views of at least one multi-fingered element in thermal proximity to a heat distribution structure.

FIGS. 8A-8H are cross-sectional views corresponding to one embodiment of a method of fabricating a semiconductor device having a heat distribution structure.

FIGS. 9A-9D are cross-sectional views corresponding to another embodiment of a method of fabricating a semiconductor device having a heat distribution structure.

Like reference numbers and designations in the various drawings indicate like elements.

DETAILED DESCRIPTION

Some embodiments described herein provide semiconductor devices having heat distribution structures and processes of making the same. In one embodiment, a heat distribution structure integrated with a semiconductor process is located in thermal proximity, defined below, to a first device and a second device of a semiconductor device or chip. The heat distribution structure comprises a thermally conductive material and reduces a thermal gradient between the first and second devices. The heat distribution structure approximately thermally matches the first device with the second device, leading to improved performance of the semiconductor device and reducing the occurrence of hot spots. In one embodiment, the heat distribution structure is a patterned diamond film.

Figure 1A:
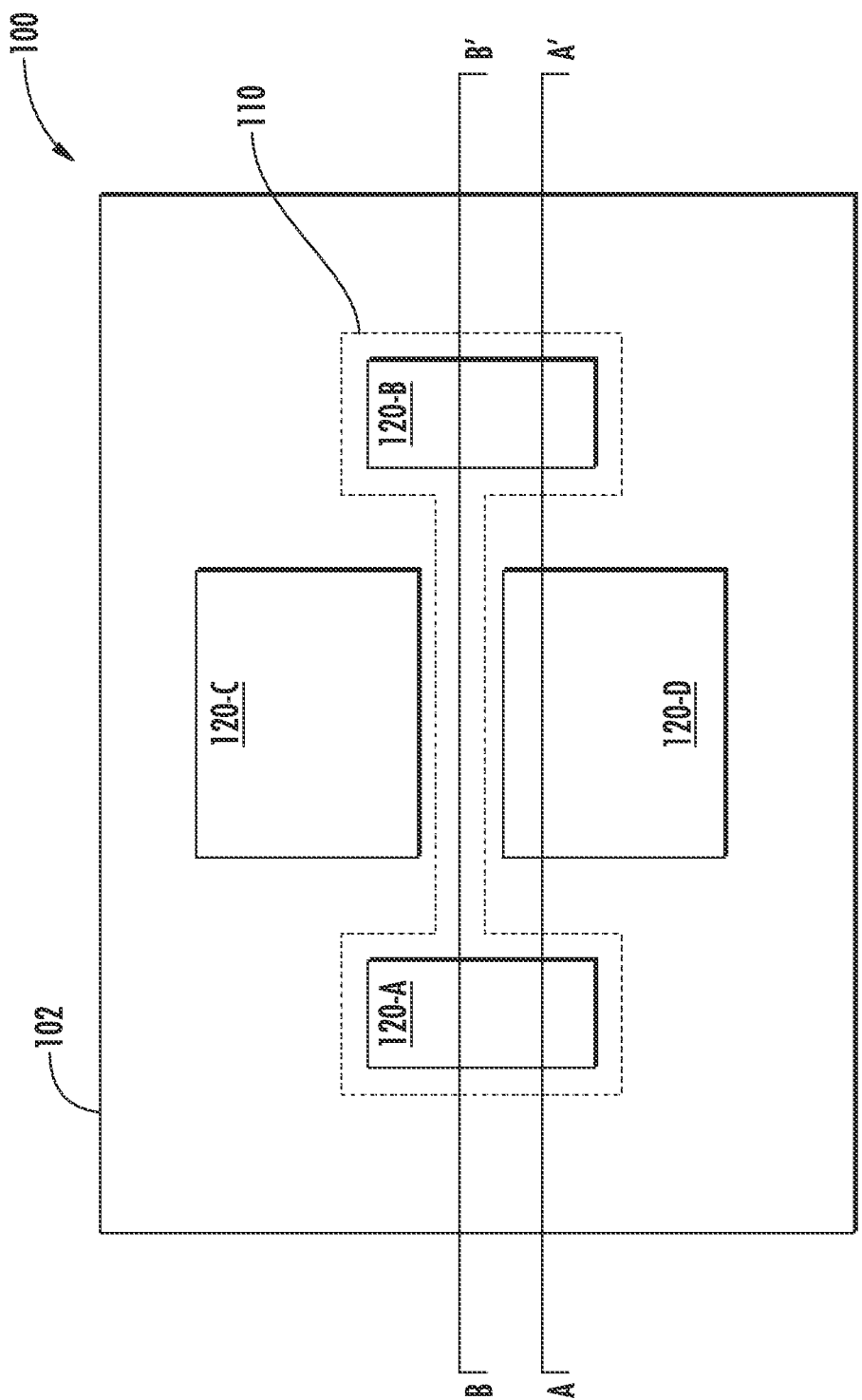

FIG. 1A is a top view of one embodiment of a chip 100 having a heat distribution structure 110. The chip 100 comprises a substrate 102 upon which a plurality of devices 120-A through 120-D (collectively referred to as "devices 120") are formed. Embodiments of the chip 100 include any semiconductor device or chip, an integrated circuit, an analog, digital, or mixed circuit, or a wafer. Example embodiments of the chip 100 employ silicon-on-insulator (SOI) or silicon-on-diamond (SOD) technology. The substrate 102 comprises any suitable substrate material including, but not limited to, silicon (Si), sapphire, diamond, silicon carbide, gallium nitride (GaN), indium phosphide (InP), or the like.

Embodiments of the devices 120-A through 120-D include any semiconductor device, circuit, sub-function, function, or an element formed on a wafer or substrate. Further embodiments of the devices 120 include a diode, a multi-fingered element, a resistor, a capacitor, a driver, an operational amplifier (op-amp), a transistor, such as a metal oxide semiconductor field-effect transistor (MOSFET), a diffused metal oxide semiconductor (DMOS) transistor, an n-channel MOSFET (NMOS), a p-channel MOSFET (PMOS), a bipolar junction transistor, a homo-junction bipolar transistor, a hetero junction bipolar transistor, an electrostatic discharge device (ESD), a power amplifier, a functional circuit, a dummy circuit, or the like. Embodiments of a DMOS transistor include lateral, vertical, or quasi-vertical DMOS transistors. Other embodiments of the devices 120 are made with technologies including complementary metal-oxide-semiconductor (CMOS), bipolar, CMOS silicon-on-insulator (SOI), BCD (bipolar, CMOS, and diffused metal oxide semiconductor) MOS, silicon germanium, silicon germanium carbon, gallium nitride, or silicon-on-diamond technologies. In some embodiments of the chip 100, each device 120 is a different type of device. In other embodiments, some or all of the devices 120 are of the same type of device.

In the embodiment shown in FIG. 1A, the heat distribution structure 110 (also referred to herein as a "thermal gradient reducing structure") is formed within the substrate 102 and is in thermal proximity to devices 120-A and 120-B, but not to devices 120-C and 120-D. Thermal proximity is any physical distance that allows heat transfer to occur between two objects, via either direct physical contact, through a medium (such as the substrate 102), or through vacuum. As used herein, when a first element is said to be within thermal proximity and a second is not, the first element receives substantially more heat transfer than the second element. Some embodiments of the heat distribution structure 110 are thermally and geometrically symmetric (as is shown in FIG. 1A), while other embodiments are asymmetric (as shown in FIG. 5, described below).

The heat distribution structure 110 is also thermally isolated. Thermal isolation occurs when a thermally conductive material is not physically connected or coupled to another thermally conductive material of approximately equal or greater conductivity. For example, a heat distribution structure 110 is thermally isolated when it is not thermally coupled (such as through a relatively high thermally conductive material such as metal) to a heat sink external to the chip 100. A thermally isolated heat distribution structure 110 or layer thereof is referred to herein as a "thermal island."

The heat distribution structure 110 approximately thermally matches devices 120-A and 120-B; that is, it reduces the thermal gradient between devices 120-A and 120-B. In one embodiment, a temperature of the heat distribution structure 110 is inclusively bounded by (that is, between or equal to) the temperatures of the devices 120-A and 120-B. For example, the temperature of the heat distribution structure 110 is approximately an average of a first temperature of the first device 120-A and a second temperature of the second device 120-B.

Some embodiments of the heat distribution structure 110 are good thermal conductors, for example, more thermally conductive than the substrate 102 or the devices 120. One embodiment of the heat distribution structure 110 comprises a diamond film. Some forms of diamond have a thermal conductivity of approximately 900 to 2320 Watts/(meter·Kelvin) and are electric insulators. A diamond film or layer spreads thermal energy at about four to ten times faster than single crystal silicon. In another embodiment, the heat distribution structure 110 is an aluminum nitride (AlN) film. The heat distribution structure 110 may be porous or non-porous. Other embodiments of the heat distribution structure 110 comprise a diamond-like substance, such as an allotrope of carbon with an approximately face-cubic crystal structure, or a composite film, such as diamond/AlN. Examples of a composite film include a diamond-like substance with embedded grains of metal or metal fill shapes between other thermally insulating layers. Additional embodiments of the heat distribution structure 110 comprise any currently known or later developed material that has a relatively high thermal conductivity, including nanometer materials and dielectric materials, and composites or combinations thereof.

As shown in FIG. 1A, the heat distribution structure 110 is a planar film formed under the devices 120-A and 120-B. In this embodiment, when devices 120-A and 120-B have disparate thermal energies (such as when one is powered on and the other is not), the heat distribution structure 110 allows the devices 120-A and 120-B to have approximately the same thermal environment regardless of the thermal symmetry of the devices 120-A and 120-B or of the overall chip 100. As used herein, thermal symmetry occurs when two or more elements have approximately the same thermal environments. For example, if device 120-A was operating at a higher current than device 120-B, device 120-A would have a higher temperature than device 120-B. Device 120-A would cause sections of the substrate 102 and heat distribution structure 110 local to device 120-A to increase in temperature. Because heat distribution structure 110 is thermally conductive, the heat distribution structure 110 achieves an approximately uniform temperature. Thus, a portion of the heat distribution structure 110 in thermal proximity to device 120-B causes the device 120-B to subsequently increase in temperature. Therefore, some of the heat generated by device 120-A is transferred to device 120-B through the heat distribution structure 110.

In yet other embodiments, the heat distribution structure 110 adds thermal stability and heat distribution to the chip 100 having an SOI substrate 102. For example, an SOI substrate 102 incorporating a diamond heat distribution structure 110 has the high thermal conductivity of diamond for heat distribution, but also provides a local constant thermal environment or a transient thermal sink. In another embodiment, a portion of the chip 100 is fabricated with an underlying diamond heat distribution structure, which provides a constant thermal plane and defines a local thermal symmetry.

FIG. 1B is a cross-sectional view of the chip 100 of FIG. 1A along line A-A'. The heat distribution structure 110 is a patterned diamond film grown or deposited over the substrate 102. In other embodiments, the heat distribution structure 110 is formed within the substrate 102. Over the heat distribution structure 110 is formed an intermediate layer 104. The intermediate layer 104 can comprise one layer or a plurality of layers. One embodiment of the intermediate layer 104 is polysilicon. A semiconductor layer 106 is formed over the intermediate layer 104. Embodiments of the semiconductor layer 106 include GaN, Si, InP, polysilicon, germanium (Ge), SiGe, aluminum gallium nitride (AlGaN), indium gallium nitride (InGaN), gallium arsenide (GaAs), or other suitable materials. Devices 120 are located on or in the semiconductor layer 106.

Figure 2A:
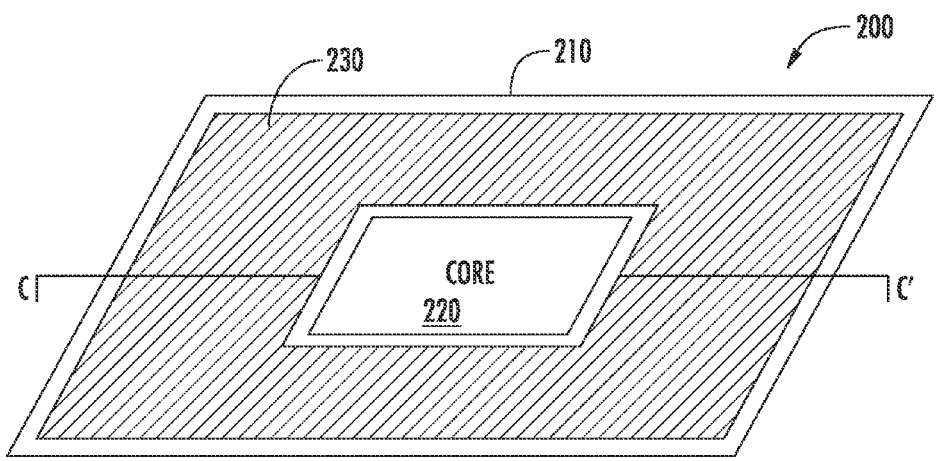
FIGS. 2A and 2B are views of one embodiment of a packaged integrated circuit.

As seen in FIG. 1B, the heat distribution structure 110 is located underneath devices 120-A and 120-B, but not under device 120-D. Therefore, devices 120-A and 120-B will be approximately thermally matched to each other while device 120-D will mostly see a different thermal environment. Similarly, FIG. 1C is a cross-sectional view of the chip 100 of FIG. 1A along line B-B'. This shows that the heat distribution structure 110 is not located underneath any other device (such as devices 120-C or 120-D). Therefore, less heat flow will occur between the heat distribution structure 110 and devices 120-C and 120-D than between the heat distribution structure 110 and devices 120-A and 120-B FIG. 2A is a top down view of one embodiment of a packaged integrated circuit (IC) 200. The packaged integrated circuit 200 has a core region 220 and an input/output (I/O) region 230. The core region 220 is in approximately the geometric center of the IC 200 and contains elements such as, but not limited to, core logic and memory cells. In this particular embodiment, the I/O region 230 contains heat-generating elements, such as, but not limited to, a power bus, at least one bond pad, at least one pin, an ESD element, an off-chip driver circuit, or a clock circuit.

Figure 2B:
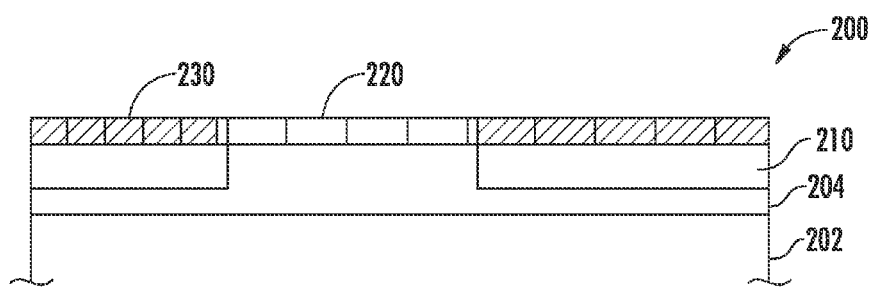

FIG. 2B is a cross-sectional view of the packaged IC 200 shown in FIG. 2A along line C-C'. A heat distribution structure 210 is located in a semiconductor layer 204 formed over a substrate 202. In one embodiment, the semiconductor layer 204 is polysilicon and the heat distribution structure 210 is diamond. In this embodiment, most of the heat in the IC 200 is generated in the I/O region 230. Therefore, the heat distribution structure 210 is located underneath the I/O region 230 but not under the core region 220. In one embodiment, the heat distribution structure 210 is patterned such that it is not formed under the core region 220. The arrangement in FIG. 2B allows heat from, for example, I/O devices or an electrostatic discharge event, to be distributed around the periphery of the IC 200 but not to the potentially more heat sensitive core region 220. In some embodiments of the IC 200, the heat from the core region 220 is managed separately (for example, through the use of a thermal island). In other embodiments, the heat distribution structure 210 is formed at least partially under the core region 220.

Figure 3A:
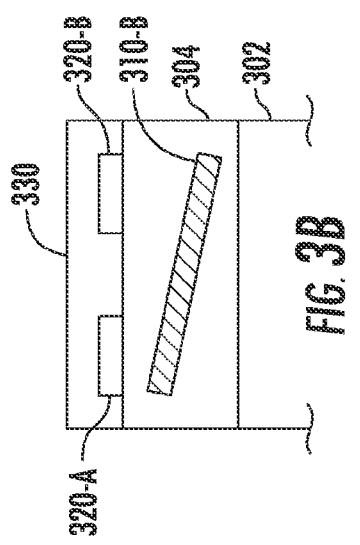
FIGS. 3A-3E are views of embodiments of two electronic devices having different thermal characteristics in thermal proximity to a heat distribution structure.

FIGS. 3A-3E are views of embodiments of two electronic devices 320-A and 320-B having different thermal characteristics in thermal proximity to a heat distribution structure. FIG. 3A is a cross-sectional view of one embodiment of devices 320-A and 320-B under a heat distribution structure 310-A. The heat distribution structure 310-A is a thermal gradient reducing film, such as diamond. The devices 320-A and 320-B are in a semiconductor layer 304 formed over a substrate layer 302. The heat distribution structure 310-A is formed over the devices 320-A and 320-B as an over layer. A metallization layer 330 is formed over the heat distribution structure 310-A. In this exemplary embodiment, the heat distribution structure 310-A is a continuous layer across the substrate 302. The heat distribution structure 310-A is also approximately parallel with a plane defined by the devices 320-A and 320-B.

Figure 3B:
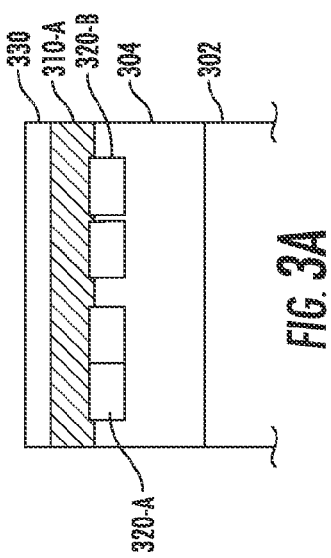

Embodiments of a heat distribution structure 310 are shaped to achieve a desired thermal environment for the devices 320-A and 320-B. Some of the embodiments of the heat distribution structure 310 control a temperature differential between the first device 320-A and the second device 320-B. FIGS. 3B-3E depict examples where the heat distribution structure 310 provides improved heat flow to or from the device 320-A when compared to the device 320-B. FIG. 3B is a cross-sectional view of another embodiment of two electronic devices 320-A and 320-B having different thermal characteristics in thermal proximity to a heat distribution structure 310-B. Therefore, the heat distribution structure 310-B facilitates a desired first temperature in the first device 320-A and a desired second temperature in the second device 320-B. The heat distribution structure 310-B forms a layer that is angled with respect to the plane defined by the devices 320-A and 320-B. This embodiment places the heat distribution structure 310-B closer to the device 320-A than it is to the device 320-B. Due to different physical separation in this embodiment, more heat transfer will occur between the device 320-A and the heat distribution structure 310-B than the device 320-B and the heat distribution structure 310-B.

Figure 3C:
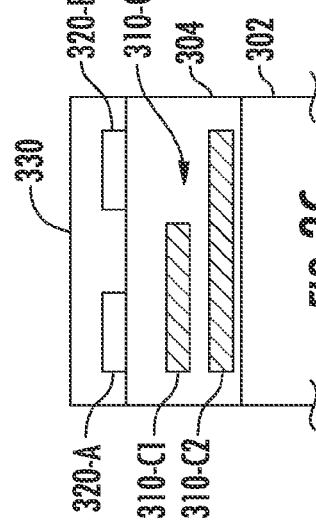

FIG. 3C is a cross-sectional view of yet another embodiment of the two electronic devices 320-A and 320-B in thermal proximity to a heat distribution structure 310-C. The heat distribution structure 310-C comprises a plurality of at least partially stacked layers 310-C1 and 310-C2. In some implementations of these embodiments, each layer of the plurality of layers is thermally isolated from the other layers of the heat distribution structure 310-C. Some implementations of the plurality of layers include a layer 310-C2 that is continuous across the substrate and another layer 310-C1 that is discontinuous. Other embodiments comprise different numbers, shape, orientation, and continuity of the plurality of layers.

Figure 3D:
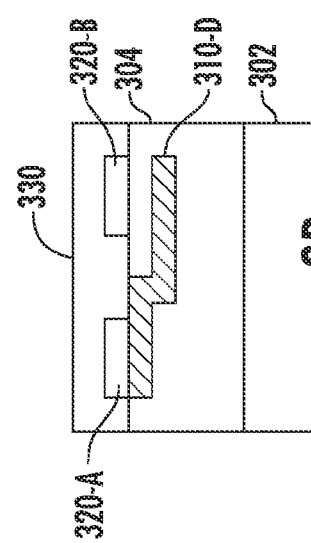
Figure 3E:
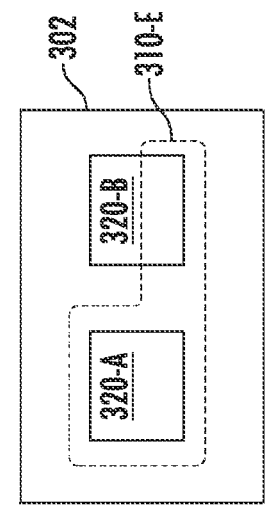

FIG. 3D is a cross-sectional view of an embodiment of the two electronic devices 320-A and 320-B in thermal proximity to a heat distribution structure 310-D. This embodiment thermally couples (such as through direct contact or through another thermally conductive medium) the heat distribution structure 310-D to the device 320-A. FIG. 3E is a top view of another embodiment of a heat distribution structure 310-E. The heat distribution structure 310-E is shaped such that device 320-A is in thermal proximity to a greater area of the heat distribution structure 310-E than the device 320-B. The first device 320-A is thermally proximate to a larger portion of the heat distribution structure 310-E than the second device 320-B. Thus, the device 320-B is exposed to less area of the heat distribution structure 310-E than device 320-A, resulting in faster heat transfer to device 320-A than to device 320-B.

FIG. 4A is a block diagram of one embodiment of an analog macro layout 400. The analog macro layout 400 is a design for an analog circuit and comprises devices 420-1 through 420-11 (collectively referred to herein as "devices 420") formed in or on a semiconductor layer 404. The devices 420 comprise any assortment of analog devices, such as, but not limited to, resistors, transistors, heaters, or capacitors. In one embodiment, the analog macro layout 400 is an op-amp. In other embodiments, the analog macro layout 400 is a macro layout for a digital or mixed signal circuit. Other embodiments of the analog macro layout 400 comprise differing numbers of devices 420.

In the embodiment shown in FIG. 4A, the analog macro layout 400 has geometric symmetry around axis 422. However, other embodiments do not have geometric symmetry, such as in FIG. 5, discussed below. The devices 420 have a first centroid. As used herein, a centroid is a geometric center of the shape of an object. Here, for example, the first centroid is a center of the area of the devices 420 taken as a whole shape, around point 432.

A heat distribution structure 410 is formed under the devices 420. This heat distribution structure 410 provides thermal symmetry for the devices 420. In other embodiments, the heat distribution structure 410 is formed over the devices 420. The heat distribution structure 410 has a second centroid, common with the first centroid. That is, the second centroid lines up with the first centroid at point 432. Therefore, in this embodiment, the analog macro layout 400 has thermal symmetry about point 432 and along axis 422.

Typically, a macro layout maintains geometric symmetry in order to have a balanced thermal environment. For example, an op-amp typically includes an input pair of transistors that is sensitive to thermal mismatch and an output pair of transistors that generates heat. Generally, the input pair and any metallization and resistors associated with the input pair are equidistant from an axis so they are exposed to about the same thermal environment with respect to symmetrically placed heating elements on the op-amp. Geometric symmetry is more challenging to achieve in large-scale integration than in small-scale integration. The heat distribution structure 410 allows asymmetrical analog macro layouts 400 because the heat distribution structure 410 is used to match the thermal environments of the input pair, rather than relying on geometric symmetry. A plurality of heat distribution structures 410 is used in some embodiments of an analog macro layout 400 in order to achieve different isotherms for different groups of devices 420.

FIG. 4B is a block diagram of one embodiment of an integrated chip layout 450 including the analog macro layout 400 of FIG. 4A. The integrated chip layout 450 comprises two power devices 440-A and 440-B. The analog macro layout 400 is located approximately next to power device 440-A. When the power devices 440-A and 440-B give off heat, a first side 412 of the analog macro layout 400 closer to the power device 440-A is exposed to more heat than a second side 414 of the analog macro layout 400 further from the power device 440-A. Uncorrected, this thermal imbalance creates a thermal distortion in the analog macro layout 400 that can lead to degraded performance. However, locating the heat distribution structure 410 under at least a portion of the analog macro layout 400 reduces distortions from nearby heat sources. That is, heat from power device 440-A will be approximately evenly distributed throughout the heat distribution structure 410, reducing the thermal gradient across the analog macro layout 400.

FIG. 5 is a block diagram of one embodiment of a chip 500 having asymmetrical thermal matching. Two elements, 520-A and 520-B, are formed on a substrate wafer 502. A heat distribution structure 510 is under a first domain 526-1 and not under a second domain 526-2. The heat distribution structure 510 is in thermal proximity to element 520-A but less so to element 520-B. As shown in FIG. 5, the heat distribution structure 510 is formed only under element 520-A. This provides uneven heating between the elements 520-A and 520-B, creating a temperature differential between them. In some embodiments of the chip 500, other devices are formed over the heat distribution structure 510 in addition to element 520-A.

The resulting temperature differential can be useful in various capacities, for example, as a thermometer. Because current and voltage are temperature dependent, temperature can be determined from a measurement of current or voltage through either of the elements 520-A and 520-B. An embodiment where a temperature differential is used is where the element 520-A is an electro-static device (ESD) and the element 520-B is a functional circuit. In such an embodiment, the ESD 520-A is powered on before the functional circuit 520-B in order to sink current. This can be utilized in, such as, for example, a band gap regulator or a comparator circuit.

Embodiments of the element 520-A also include an ESD network or circuit, including, but not limited to, a silicon-on-diamond (SOD) ESD structure, an SOD ESD device, and an SOD ESD circuit. In other embodiments, element 520-A is a reference element and element 520-B is a differential element, or vice versa.

FIG. 6 is a top down view of one embodiment of a heat distribution structure 610 for improving performance of an electrical connection 624 of an output device 620. The output device 620 is formed on a wafer 602. In one embodiment, the output device 620 is a multi-fingered MOSFET for use in a power management chip, but other embodiments include a bipolar transistor or other output device. The output device 620 comprises a plurality of drain, gate, and source regions. Embodiments of the output device 620 have a metal system 625 comprising a plurality of metal layers that use vias to connect to each other. A lower metal 626 couples together the drain, source, and gate regions. In one implementation, the lower metal 626 widens as it picks up additional current to protect against electro-migration. An upper metal 624 collects current from the lower metal 626. The upper metal 624 couples the output device 620 to a bond pad 630.

The metal system 625 of the output device 620 is subject to overheating as current is added to the metal layers 624 and 626. As resistivity typically increases with increasing temperature, the performance of the lower metal 626 and the upper metal 624 will decrease with increasing temperature. The heat distribution structure 610 is formed over or under the output device 620, the upper metal 624, and the bond pad 630. The heat from the output device 602 is spread to the bond pad 630, which is less sensitive to temperature. In this manner, the heat distribution structure 610 functions as a heat pipe used to selectively conduct heat from a thermally sensitive device (such as the output device 620) to a less thermally sensitive device (such as the bond pad 630 or a bond wire). In one embodiment, the heat distribution structure 610 is in direct contact with the upper metal 624. In some embodiments, the heat distribution structure 610 comprises a diamond or diamond-like layer that is formed using an alternative diamond deposition method, such as carbon-like inter-dielectric layers.

FIG. 7A is a cross-sectional view of a multi-fingered element 720 in thermal proximity to a heat distribution structure 710. The multi-fingered element 720 and the heat distribution structure 710 are formed in a semiconductor substrate 702. The multi-fingered element 720 is symmetrical around an axis of thermal symmetry 722. In one embodiment, the multi-fingered element 720 is a PN junction diode that has alternating P+ and N+ doped regions 724 as well as trench regions 726. In one embodiment, the trench regions 726 are formed using shallow trench isolation (STI) techniques. Embodiments of the trench region 726 are filled with a dielectric material, such as silicon dioxide ($SiO_2$). In some embodiments, at least one dielectric layer and at least one metal layer are formed over the semiconductor substrate 702.

FIG. 7A depicts a plurality of fingers having symmetry along axis 722 and is aligned vertically over the heat distribution structure 710. Some embodiments of the heat distribution structure 710 are continuous throughout the semiconductor substrate 702, other embodiments are thermal islands, and yet other embodiments have different geometries and interconnections of the heat distribution structure 710. For example, in one embodiment, the heat distribution structure 710 is patterned to thermally match individual fingers of the multi-fingered element 720, that is, each individual finger is made approximately the same temperature as each other finger. Embodiments of the multi-finger element 720 can be a passive or active element, including, but not limited to, bipolar transistors, MOSFETs, DMOS transistors, resistors, inductors or capacitors.

Figure 7B:
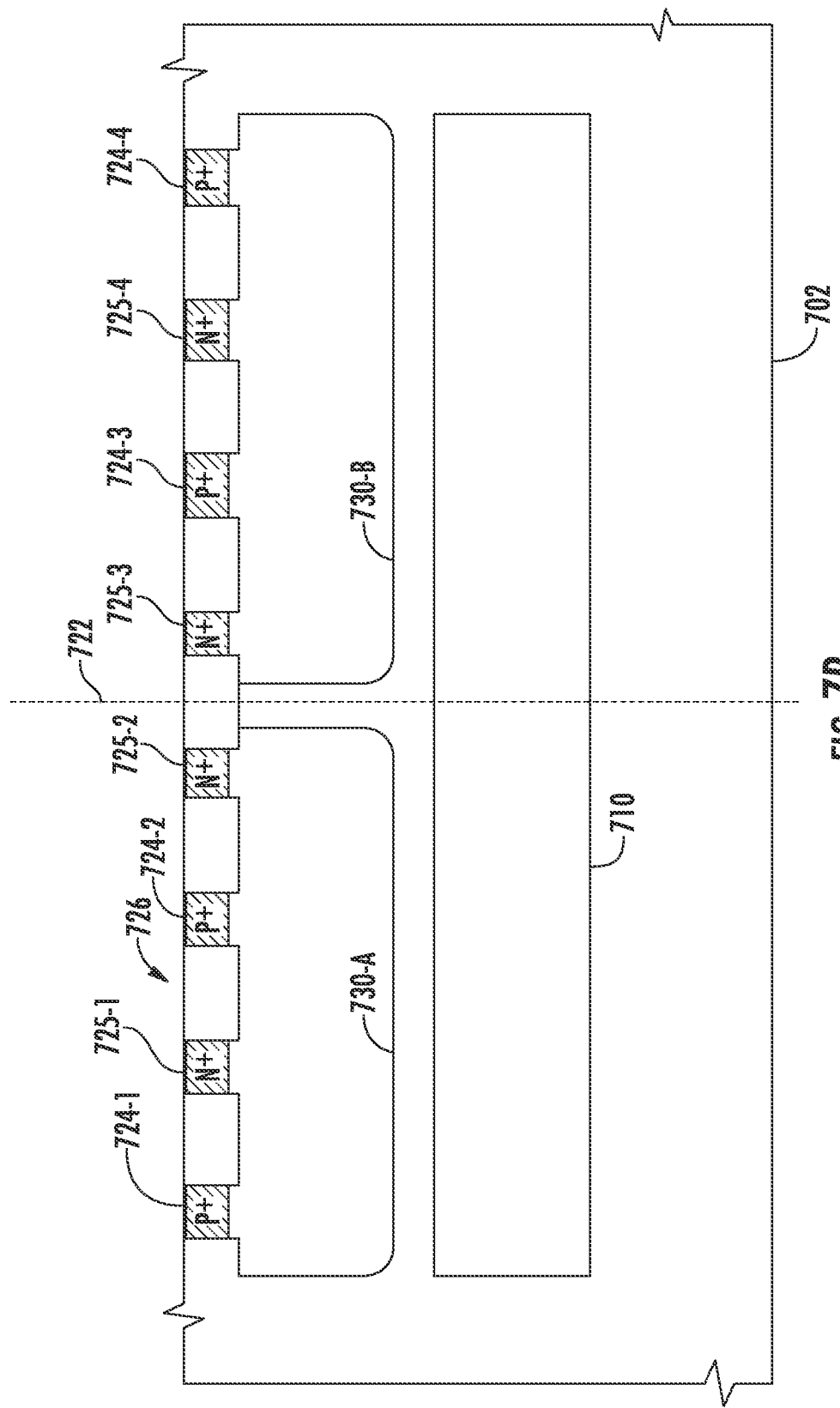

FIG. 7B is a cross-sectional view of a first multi-fingered element 730-A and a second multi-fingered element 730-B in thermal proximity to the heat distribution structure 710. The heat distribution structure 710 approximately thermally matches the elements 730. The first multi-fingered element 730-A and the second multi-fingered element 730-B (collectively referred to herein as "elements 730") have separate n-well regions and are symmetrical around axis 722. The elements 730-A and 730-B also have N+regions 725-1 through 725-4 and P+regions 724-1 through 724-4. In some embodiments, the elements 730 are located remotely from each other in semiconductor substrate 702. In one implementation, the elements 730 are electrically connected to a node, while they are electrically separated in other implementations. As used herein, electrically separated (also referred to herein as "electrically disconnected") refers to two or more devices that are not directly electrically connected, are indirectly electrically connected through other elements or devices, or are not electrically connected at all. Other embodiments include additional elements, either electrically coupled or not, in thermal proximity to the heat distribution structure 710.

FIG. 7C shows a cross-sectional view of an embodiment of a differential circuit 750 in thermal proximity to the heat distribution structure 710. A first element 740-A is connected to a positive side of a differential circuit and a second element 740-B is connected to a negative side of the differential circuit. In one embodiment, the first element 740-A is a first PN diode and the second element 740-B is a second PN diode. The first PN diode 740-A is coupled to an electrically positive side of the differential circuit 750 at VDD, IN(+), VDD, and IN(+). The second PN diode 740-B is coupled to an electrically negative side of the differential circuit 750 at IN(−), VSS, and IN(−). The heat distribution structure 710 provides an approximately matched thermal environment between the first and second PN diodes 740-A and 740-B. Embodiments of the differential circuit 750 are analog, digital, or mixed signal circuits.

FIGS. 8A-8H are cross-sectional views corresponding to one embodiment of a method of fabricating of a semiconductor device 800 having a heat distribution structure 810. For exemplary purposes, an embodiment where the heat distribution structure 810 is diamond will be discussed throughout FIGS. 8A-8H; however, it is to be understood that the method applies to any material used for the heat distribution structure 810. In FIG. 8A, a first layer 804 is formed over a first substrate 802. As described herein, the semiconductor device 800 is fabricated upside down, such that the first substrate 802 becomes a device layer later in the fabrication process. The first substrate 802 comprises a material that is conducive to the nucleation and growth of the material of the heat distribution structure 810 (such as Si or silicon nitride ($Si_3N_4$)). In contrast, the first layer 804 discourages nucleation and growth of the heat distribution structure 810 (such as silicon dioxide ($SiO_2$)). Thus, the first substrate 802 is conducive to the growth and nucleation of diamond and the first layer 804 is not. In one embodiment, the first layer 804 is approximately 100 Angstroms (Å) up to approximately 1 micron (μm) thick, but can be any other thickness.

In FIG. 8B, the first layer 804 is patterned in a shape desired for the heat distribution structure 810. In one embodiment, the shape of the heat distribution structure 810 is based on a desired thermal symmetry of a device or of devices. In another embodiment, where the first layer 804 is conducive to the growth of diamond and the substrate 802 is not conducive to the growth of diamond, the first layer 804 is etched to form the desired pattern upon which the diamond is grown.

FIG. 8C shows the semiconductor device 800 after the heat distribution structure 810 is grown or deposited. In some embodiments, the heat distribution structure 810 is grown using selective epitaxial growth (SEG) or epitaxial lateral overgrowth (ELO). SEG and ELO are techniques for epitaxially growing a material on a semiconductor substrate or other layer. In some embodiments, a spurious amount of diamond 812 is formed on the first layer 804. In one embodiment, the diamond heat distribution structure 810 is approximately up to 1000 Å or up to approximately 1 μm thick, however, other thicknesses are contemplated.

FIG. 8D shows the results of removal of the first layer 804. Any spurious diamond 812 is removed with the first layer 804. The first layer 804 is removed using lift off or a strip, for example. Next, a bonding layer 808 is deposited, as shown in FIG. 8E. In some embodiments, the bonding layer 808 is polysilicon or $SiO_2$ and is up to approximately 1000 Å or up to approximately 2 μm thick, however, other thicknesses are contemplated. The bonding layer 808 is planarized as shown in FIG. 8F to form a bonding surface. The bonding layer 808 is then bonded to a second substrate 806 in FIG. 8G. In some embodiments, the bonding process is, for example, Si-Si or oxide-oxide, depending on the composition of the bonding layer 808. In one embodiment, the second substrate 806 is a handle wafer. FIG. 8H shows the result of planarization of the semiconductor substrate 802 to the thickness of the desired semiconductor device layer. The substrate 802 becomes the semiconductor device layer. In one embodiment, the device layer 806 is approximately 100 Å up to approximately 20 μm thick, depending, for example, upon intended usage and voltage range. Devices, circuits, or other elements are subsequently formed on the device layer 802.

FIGS. 9A-9D are cross-sectional views corresponding to another embodiment of a method of fabricating a semiconductor device 900 having a heat distribution structure 910. FIG. 9A shows a second layer 906 formed over a first layer 904 on a substrate 902. The material of the heat distribution structure 910 attaches to first layer 904 and less so to the second layer 906. In one embodiment, the first layer 904 comprises $Si_3N_4$ and the second layer 906 comprises $SiO_2$. In one embodiment, the first layer 904 and second layer 906 each are approximately 100 Å up to approximately 1 μm thick.

The second layer 906 is then patterned for the desired shape of the heat distribution structure 910 as shown in FIG. 9B. FIG. 9C shows the heat distribution structure 910 deposited or grown over the first layer 904. FIG. 9D shows the semiconductor device 900 after the second layer 906 is removed.

Embodiments of the semiconductor device 900 undergo further processing as described above with respect to FIGS. 8E and 8F. The method described in FIGS. 9A-9D can be used when the substrate 902 is not conducive to the growth or nucleation of the material of the heat distribution layer 910. The first layer 904 can also serve as a containment layer, reducing the possibility of contaminating the substrate 902 with material from the heat distribution structure 910.

In another embodiment, a diamond damascene process is used, as described in U.S. Provisional Patent Application No. 61/286,440, incorporated herein by reference. In additional embodiments, the heat distribution structure 910 is deposited as a blanket layer and patterned using an etch step, for example, using an $O_2$ plasma etch, a laser, ablation, or by similar techniques. A blanket deposition is used, for example, when the heat distribution structure 910 is thin. In other embodiments, diamond is selectively deposited. In yet further embodiments, a diamond over layer is formed on top of circuits, elements, or devices formed on a semiconductor layer (for example, diamond is deposited and patterned on top of an otherwise fully formed integrated circuit). Refractory metals or a metal such as Tungsten may be used in embodiments where the heat distribution structure requires a high temperature for formation and is formed as an over layer.

Figure 10:
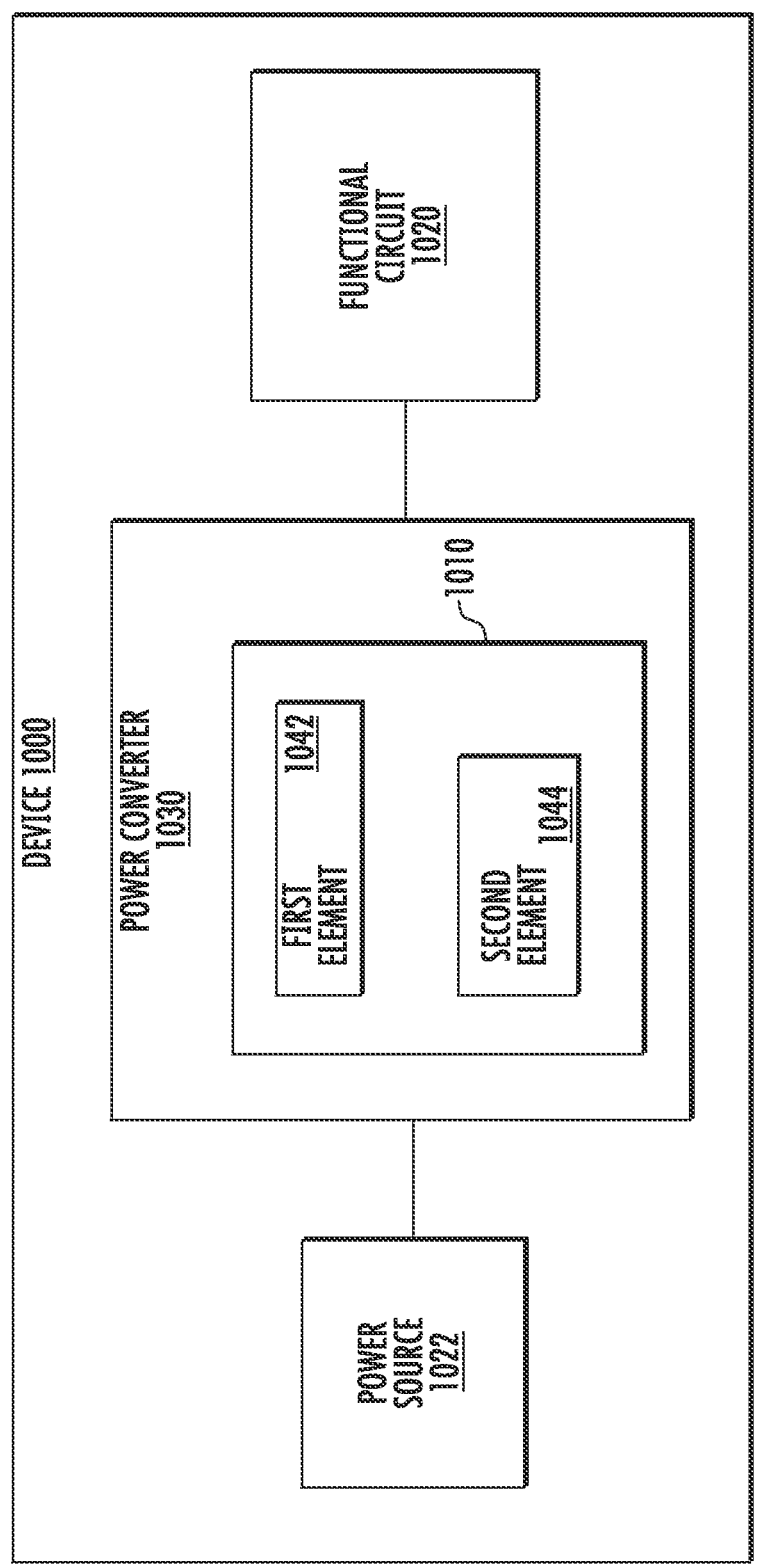
FIG. 10 is a block diagram of a device comprising a power converter having a heat distribution structure in thermal proximity to two circuit elements.

FIG. 10 is a block diagram of a device 1000 comprising a power converter 1030 having a heat distribution structure 1010 in thermal proximity to two circuit elements. The device 1000 comprises the power converter 1030 coupled to a power source 1022 and a functional circuit 1020. The power converter 1030 comprises at least a first element 1042 and at least a second element 1044. In the embodiment shown in FIG. 10, the heat distribution structure 1010 is in thermal proximity to the first element 1042 and the second element 1044.

In one embodiment, the first element 1042 is a high side circuit and the second element 1044 is a low side circuit. During the majority of time, the power converter 1030 is operating, only one of the high side circuit 1042 and the low side circuit 1044 is powered on. Heat generated from the high side circuit 1042 when it is powered on is distributed to the low side circuit 1044 via the heat distribution structure 1010. Similarly, heat generated from the powered on low side circuit 1044 is distributed to the high side circuit 1042 via the heat distribution structure 1010. The heat distribution structure 1010 approximately thermally matches the high side circuit 1042 and the low side circuit 1044.

In another embodiment, the power source 1022 or processing circuitry 1020 are external to the device 1000. The device 1000 is any electronic device, such as a cell phone, computer, navigation device, microprocessor, a high frequency device, a power management device, a band gap filter device, a power converter, etc. Embodiments of the power converter 1030 described herein can be implemented in other power devices, high-power density and high-efficiency DC power converters, and high voltage AC/DC power converters, or any other application where a power converter 1030 having a heat distribution structure 1030 can be used. In other embodiments, the power converter 1030 comprises any embodiment of a semiconductor device or chip described above.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

A computer or processor implementing the various embodiments described above can be implemented using software, firmware, hardware, or any appropriate combination thereof, as known to one of skill in the art. These may be supplemented by, or incorporated in, specially designed application-specific integrated circuits (ASICs) or field-programmable gate arrays (FPGAs). The computer or processor can also include or function with software programs, firmware, or other computer-readable instructions for carrying out various process tasks, calculations, and control functions used in the present method and system.

Embodiments of the methods described above can be implemented by computer-executable instructions, such as program modules or components, which are executed by a processor. Generally, program modules include routines, programs, objects, data components, data structures, algorithms, and the like, which perform particular tasks or implement particular abstract data types. In one embodiment, the processor controls machinery used in fabrication of semiconductor devices.

Instructions for carrying out the various process tasks, calculations, and generation of other data used in the operation of the methods and systems of the invention can be implemented in software, firmware, or other computer-readable instructions. These instructions are typically stored on any appropriate computer program product that includes a computer-readable medium used for storage of computer-readable instructions or data structures. Such a computer-readable medium can be any available media accessible by a general purpose or special purpose computer or processor, or any programmable logic device.

Suitable computer-readable storage media may include, for example, non-volatile memory devices including semiconductor memory devices such as EPROM, EEPROM, or flash memory devices; magnetic disks such as internal hard disks or removable disks; magneto-optical disks; CDs, DVDs, or other optical storage disks; nonvolatile ROM, RAM, and other like media; or any other media that can be used to carry or store desired program code in the form of computer-executable instructions or data structures.

The embodiments described herein provide a patterned heat distribution structure that is used to create thermal symmetry regardless of layout symmetry. Thus, thermal symmetries in macros can be retained when used in larger designs. The heat distribution structures provide local heat spreading and reduce thermal gradients. The methods described herein also apply to wafer-scale integration.

A number of embodiments of the invention defined by the following claims have been described. Nevertheless, it will be understood that various modifications to the described embodiments may be made without departing from the spirit and scope of the claimed invention. Features and aspects of particular embodiments described herein can be combined with or replace features and aspects of other embodiments. Accordingly, other embodiments are within the scope of the following claims.

What is claimed is:

1. A method of fabricating a chip, comprising:
    forming a heat distribution structure over a first substrate;
    forming a first element and a second element over the heat distribution structure; and
    forming a third element not over the heat distribution structure;
    wherein at least a portion of the heat distribution structure is under the entire first element and the entire second element and provides thermal distribution approximately thermally matching the first element and the second element, and is thermally isolated within the chip from the third element.

2. The method of claim 1, wherein forming a heat distribution structure comprises forming the heat distribution structure within the first substrate, wherein the heat distribution structure has a larger thermal conductivity than the first substrate.

3. The method of claim 1, wherein the heat distribution structure approximately thermally matches the first element and the second element.

4. The method of claim 1, further comprising:
    depositing a first layer over the first substrate, wherein the first layer comprises a material not conducive to the growth of a material of the heat distribution structure; and
    patterning the first layer to expose a portion of the first substrate to form a selected shape of the heat distribution structure, wherein the first substrate comprises a material conducive to growth of the material of the heat distribution structure;
    wherein forming the heat distribution structure comprises growing the heat distribution structure over the exposed portion of the first substrate.

5. The method of claim 4, wherein the heat distribution structure comprises diamond grown on the exposed portion of the first substrate.

6. The method of claim 1, further comprising:
    forming a bonding layer over the heat distribution structure; and
    bonding a second substrate to the bonding layer.

7. The method of claim 1, further comprising:
    depositing a first layer over the first substrate, wherein the first layer is conducive to the growth of diamond;
    depositing a second layer over the first layer, wherein the second layer is not conducive to the growth of diamond;
    patterning the second layer to expose a portion of the first layer;
    wherein forming the heat distribution structure further comprises growing diamond over the exposed portion of the first layer.

8. The method of claim 1, wherein forming the heat distribution structure further comprises forming the heat distribution structure within the first substrate.

9. The method of claim 1, further comprising:
    forming a metallization layer over the heat distribution structure, wherein the heat distribution structure is an over layer formed over at least the first substrate and is not located within the substrate.

10. The method of claim 1, further comprising:
    patterning the heat distribution structure such that it provides thermal matching for a plurality of fingers of the first element, wherein the first element is a multi-fingered element.

* * * * *